(12) United States Patent
Kameyama et al.

(10) Patent No.: US 6,466,054 B2
(45) Date of Patent: Oct. 15, 2002

(54) LEVEL CONVERTER CIRCUIT

(75) Inventors: Atsushi Kameyama; Tsuneaki Fuse, both of Tokyo; Kazunori Ohuchi; Masako Yoshida, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/811,699

(22) Filed: Mar. 20, 2001

(65) Prior Publication Data

US 2001/0024130 A1 Sep. 27, 2001

(30) Foreign Application Priority Data

Mar. 27, 2000 (JP) .................................. 2000-086385
Oct. 25, 2000 (JP) .................................. 2000-325047

(51) Int. Cl.[7] ............................................. H03K 19/0175
(52) U.S. Cl. ............................. 326/68; 326/63; 326/80; 326/83
(58) Field of Search .......................... 326/63, 68, 80, 326/81, 83

(56) References Cited

U.S. PATENT DOCUMENTS

| 3,967,252 A | | 6/1976 | Donnelly | 340/173 |
|---|---|---|---|---|
| 4,060,740 A | | 11/1977 | Nishimura | 307/362 |
| 5,128,940 A | * | 7/1992 | Wakimoto | 327/117 |
| 5,157,281 A | * | 10/1992 | Santin et al. | 257/371 |
| 5,204,557 A | * | 4/1993 | Nguyen | 326/17 |
| 5,723,986 A | * | 3/1998 | Nakashiro et al. | 326/63 |
| 6,043,699 A | * | 3/2000 | Shimizu | 326/80 |
| 6,066,975 A | * | 5/2000 | Matano | 326/62 |

OTHER PUBLICATIONS

Y. Nakagome et al., "Sub–1–V Swing Bus Architecture for Future Low–Power ULSIs", *1992 Symposium on VLSI Circuits Digest of Technical Papers*, pp. 82–83, (1992).

* cited by examiner

*Primary Examiner*—Michael G. Lee
*Assistant Examiner*—Steven S. Paik
(74) *Attorney, Agent, or Firm*—Finnegan, Henderson, Farabow, Garrett & Dunner, L.L.P.

(57) ABSTRACT

A level converter circuit includes two p-channel MOSFETs and two n-channel MOSFETs of gate-grounded type which receive complementary signals from a logic circuit, p-channel cross-coupled FETs, and n-channel cross-coupled FETs. The two FETs constructing each cross-coupled FETs can be driven by complementary inputs by supplying an output of the logic circuit operated on a low voltage and a logically inverted output thereof to each cross-coupled FETs via the gate-grounded FETs, and as a result, the gain characteristic of the cross-coupled FETs can be enhanced. The level converter circuit with low power consumption which has large tolerance for the element characteristic and converts a logic level which is as low as approximately 0.5V to approximately 1V to 3V which is a normal logic level.

18 Claims, 12 Drawing Sheets

| VDD (V) \ VD1 (V) | 0.20 | 0.30 | 0.40 | 0.50 | 0.60 | 0.70 | 0.80 | 0.90 | 1.00 | 1.10 | 1.20 | 1.30 | 1.40 | 1.50 |
|---|---|---|---|---|---|---|---|---|---|---|---|---|---|---|
| 3.30 | | | | | | | | | | | | | | |
| 3.20 | | | | | | | | | | | | >25 | 7.222 | 2.431 |
| 3.10 | | | | | | | | | | | | 24.457 | 5.072 | 1.984 |
| 3.00 | | | | | | | | | | | | 16.142 | 3.529 | 1.676 |
| 2.90 | | | | | | | | | | | >25 | 10.196 | 2.564 | 1.510 |
| 2.80 | | | | | | | | | | | >25 | 6.263 | 1.979 | 1.406 |
| 2.70 | | | | | | | | | | | 13.949 | 3.847 | 1.638 | 1.323 |
| 2.60 | | | | | | | | | | | 7.061 | 2.522 | 1.458 | 1.295 |
| 2.50 | | | | | | | | | | 18.185 | 3.727 | 1.868 | 1.406 | 1.300 |
| 2.40 | | | | | | | | | | 6.876 | 2.273 | 1.588 | 1.363 | 1.299 |
| 2.30 | | | | | | | | | 20.467 | 3.035 | 1.749 | 1.477 | 1.373 | 1.322 |
| 2.20 | | | | | | | | | 4.746 | 1.975 | 1.583 | 1.446 | 1.379 | 1.350 |
| 2.10 | | | | | | | | | | 1.728 | 1.568 | 1.444 | 1.406 | 1.385 |
| 2.00 | | | | | | | | | | | 1.568 | 1.471 | 1.446 | 1.427 |
|  | | | | | | | | | | | | 1.520 | 1.495 | 1.480 |

UNIT : ns

FIG. 6 PRIOR ART

| VDD (V) \ VD1 (V) | 0.20 | 0.30 | 0.40 | 0.50 | 0.60 | 0.70 | 0.80 | 0.90 | 1.00 | 1.10 | 1.20 | 1.30 | 1.40 | 1.50 |
|---|---|---|---|---|---|---|---|---|---|---|---|---|---|---|
| 3.30 | | | >25 | 10.412 | 3.240 | 1.847 | 1.457 | 1.313 | 1.267 | 1.184 | 1.165 | 1.147 | 1.115 | 1.105 |
| 3.20 | | | >25 | 10.117 | 3.247 | 1.850 | 1.461 | 1.323 | 1.233 | 1.197 | 1.177 | 1.158 | 1.125 | 1.120 |
| 3.10 | | | >25 | 10.193 | 3.195 | 1.849 | 1.466 | 1.334 | 1.245 | 1.213 | 1.189 | 1.169 | 1.148 | 1.130 |
| 3.00 | | | >25 | 10.161 | 3.200 | 1.835 | 1.485 | 1.313 | 1.254 | 1.212 | 1.204 | 1.184 | 1.160 | 1.143 |
| 2.90 | | | >25 | 9.935 | 3.174 | 1.835 | 1.501 | 1.388 | 1.295 | 1.239 | 1.219 | 1.199 | 1.173 | 1.163 |
| 2.80 | | | >25 | 9.840 | 3.175 | 1.848 | 1.502 | 1.403 | 1.310 | 1.257 | 1.234 | 1.210 | 1.193 | 1.186 |
| 2.70 | | | >25 | 9.802 | 3.161 | 1.845 | 1.499 | 1.417 | 1.332 | 1.276 | 1.255 | 1.233 | 1.214 | 1.204 |
| 2.60 | | | >25 | 9.639 | 3.159 | 1.865 | 1.519 | 1.394 | 1.322 | 1.298 | 1.275 | 1.249 | 1.241 | 1.232 |
| 2.50 | | | >25 | 9.610 | 3.139 | 1.875 | 1.542 | 1.419 | 1.367 | 1.338 | 1.298 | 1.276 | 1.268 | 1.260 |
| 2.40 | | | >25 | 9.510 | 3.146 | 1.890 | 1.596 | 1.487 | 1.380 | 1.353 | 1.330 | 1.308 | 1.298 | 1.293 |
| 2.30 | | | >25 | 9.294 | 3.135 | 1.916 | 1.626 | 1.486 | 1.415 | 1.393 | 1.359 | 1.349 | 1.339 | 1.326 |
| 2.20 | | | >25 | 9.117 | 3.129 | 1.938 | 1.660 | 1.512 | 1.478 | 1.435 | 1.407 | 1.391 | 1.380 | 1.371 |
| 2.10 | | | >25 | 9.148 | 3.138 | 1.958 | 1.678 | 1.573 | 1.521 | 1.469 | 1.450 | 1.440 | 1.426 | 1.419 |
| 2.00 | | | >25 | 8.950 | 3.144 | 2.003 | 1.751 | 1.610 | 1.574 | 1.537 | 1.507 | 1.496 | 1.484 | 1.476 |

UNIT : ns

FIG. 14

| VDD (V) \ VD1 (V) | 0.20 | 0.30 | 0.40 | 0.50 | 0.60 | 0.70 | 0.80 | 0.90 | 1.00 | 1.10 | 1.20 | 1.30 | 1.40 | 1.50 |
|---|---|---|---|---|---|---|---|---|---|---|---|---|---|---|
| 3.30 | | | 5.349 | 1.636 | 1.376 | 1.285 | 1.233 | 1.199 | 1.176 | 1.157 | 1.140 | 1.128 | 1.124 | 1.111 |
| 3.20 | | | 4.431 | 1.619 | 1.382 | 1.297 | 1.250 | 1.214 | 1.188 | 1.173 | 1.157 | 1.142 | 1.135 | 1.131 |
| 3.10 | | | 3.713 | 1.625 | 1.392 | 1.305 | 1.256 | 1.223 | 1.202 | 1.190 | 1.170 | 1.156 | 1.152 | 1.139 |
| 3.00 | | | 3.197 | 1.590 | 1.399 | 1.322 | 1.275 | 1.243 | 1.219 | 1.203 | 1.189 | 1.179 | 1.174 | 1.161 |
| 2.90 | | | 2.816 | 1.586 | 1.416 | 1.338 | 1.294 | 1.260 | 1.242 | 1.225 | 1.209 | 1.197 | 1.187 | 1.181 |
| 2.80 | | | 2.542 | 1.589 | 1.427 | 1.364 | 1.316 | 1.286 | 1.259 | 1.245 | 1.232 | 1.218 | 1.213 | 1.201 |
| 2.70 | | | 2.335 | 1.588 | 1.456 | 1.383 | 1.344 | 1.316 | 1.288 | 1.268 | 1.253 | 1.239 | 1.236 | 1.220 |
| 2.60 | | | 2.190 | 1.614 | 1.473 | 1.411 | 1.369 | 1.352 | 1.319 | 1.295 | 1.278 | 1.271 | 1.259 | 1.245 |
| 2.50 | | | 2.096 | 1.608 | 1.524 | 1.446 | 1.404 | 1.384 | 1.346 | 1.329 | 1.312 | 1.299 | 1.288 | 1.279 |
| 2.40 | | | 2.020 | 1.655 | 1.541 | 1.485 | 1.447 | 1.415 | 1.381 | 1.365 | 1.345 | 1.334 | 1.321 | 1.313 |
| 2.30 | | | 1.996 | 1.686 | 1.598 | 1.529 | 1.484 | 1.447 | 1.415 | 1.404 | 1.382 | 1.371 | 1.357 | 1.347 |
| 2.20 | | | 2.010 | 1.755 | 1.660 | 1.576 | 1.525 | 1.494 | 1.465 | 1.443 | 1.426 | 1.414 | 1.398 | 1.389 |
| 2.10 | | | 2.076 | 1.842 | 1.744 | 1.654 | 1.584 | 1.546 | 1.520 | 1.495 | 1.476 | 1.462 | 1.446 | 1.437 |
| 2.00 | | | 2.131 | 1.937 | 1.847 | 1.718 | 1.659 | 1.608 | 1.576 | 1.554 | 1.534 | 1.519 | 1.504 | 1.493 |

UNIT : ns

FIG. 17

LEVEL CONVERTER CIRCUIT

CROSS-REFERENCE TO RELATED APPLICATIONS

This application is based upon and claims the benefit of priority from the prior Japanese Patent Applications No. 2000-086385, filed Mar. 27, 2000; and No. 2000-325047, filed Oct. 25, 2000, the entire contents of both of which are incorporated herein by reference.

BACKGROUND OF THE INVENTION

This invention relates to a level converter circuit operated by using a plurality of power supplies.

Recently, the number of semiconductor elements formed on a chip has significantly increased. Several hundreds of millions of semiconductor elements are integrated per chip in a gigabit-order semiconductor memory, and several tens of thousands to tens of millions of semiconductor elements are integrated per chip in a 64-bit microprocessor. The number of semiconductor elements formed on a chip can be improved by reducing the size of semiconductor elements. Currently, in a 1-Gbit DRAM (Dynamic Random Access Memory), MOS transistors with a gate length of 0.15 $\mu$m are used. To further increase the number of semiconductor elements formed on a chip, MOS transistors with a gate length of 0.1 $\mu$m or less will need to be used.

In the above fine patterned MOS transistor, hot carriers deteriorate the transistor and an insulating film is destroyed by TDDB (Time Dependent Dielectric Breakdown). Further, a junction breakdown voltage of a source and drain is lowered when the impurity concentrations of a substrate region and a channel region are increased in order to suppress a lowering in a threshold voltage due to a reduction in the channel length. Lowering a power supply voltage keeps the reliability of the fine patterned element high. That is, weakening a lateral electric field between the source and the drain prevents hot carriers and weakening the vertical electric field between the gate and the bulk prevents TDDB. Further, by lowering the power supply voltage, reverse bias voltages applied to a junction between the source and the bulk and a junction between the drain and the bulk are lowered so as to cope with a lowering in a withstand voltage.

Recently, the market for portable information devices has remarkably increased. Most of the portable information devices employ a lightweight power supply, such as a lithium ion battery having a high energy density. However, the three volts (3V) of the lithium ion battery is higher than the withstand voltage of the fine patterned MOS transistor. Therefore, when the lithium ion battery is applied to a circuit comprising the fine patterned transistor, a power supply voltage converter must be used to reduce the voltage. The power consumed during the operation of a CMOS circuit used in a logic circuit is not only proportional to an operational frequency, but also proportional to the square of the power supply voltage. Therefore, reducing the power supply voltage significantly lowers the power consumption in the chip.

Therefore, to use a portable device for a longer period of time, it is required to develop a battery with high energy density, a power supply conversion circuit with high efficiency, and an integrated circuit operated at a low voltage. It is desirable to use the lowered power supply voltage in a base-band LSI and microprocessor with large power consumption from the viewpoint of attainment of the low power consumption.

In the portable information device, it is necessary to use a memory device such as a DRAM or SRAM in addition to a logic circuit. The DRAM is designed to attain a sufficient charge amount of a cell to enhance a soft error resistance and the SRAM is designed to prevent a lowering in the operation speed at the time of the low-voltage operation. Therefore, there are no significant measures for making the power consumption low as in the logic circuit, and at present, elements operated on a power supply voltage of approximately 1.75V are put into practice. However, since the power supply voltage of the memory circuit is greatly different from that of the logic circuit, it is necessary to use a multiple power supply construction for supplying various power supply voltages in an LSI having a memory circuit and a logic circuit.

FIG. 1 shows the construction of a semiconductor integrated circuit 405 for a portable information device having a memory circuit and logic circuit integrated on one chip and a power supply system thereof. The circuit of FIG. 1 includes a lithium battery (lithium ion secondary battery) 400, a power supply conversion circuit 401, a logic circuit 402, an on-chip memory circuit 403, and a level converter 404. The output power supply voltage 3V of the lithium battery 400 is converted into 0.5V by the power supply conversion circuit 401 to supply a 0.5V power supply voltage to the logic circuit 402. Since the on-chip memory circuit 403 requires a power supply voltage of 1V or more for its operation, the output power supply voltage 3V of the lithium battery 400 is supplied directly to the memory circuit 403. The 3V power supply voltage and 0.5V power supply voltage are supplied to the level converter 404, which connects the memory circuit 403 and logic circuit 402.

With the construction shown in FIG. 1, setting the power supply voltage of the logic circuit 402 to 0.5V can lower the power consumption at an operation time. However, when the power supply voltage of a general CMOS circuit is simply lowered from 3V and operated on a power supply voltage of 2V, , the operation speed of the device is lowered or the device will not correctly operate. To solve the above problem, it is necessary to lower the threshold voltage of the MOS transistor with a lowering in the power supply voltage. For example, to construct a logic circuit that operates on a low power supply voltage of 0.5V, it is necessary to use an FET having a threshold voltage of 0.1V to 0.2V in the absolute value that is equal to approximately ⅓ of the threshold voltage of the conventional FET.

However, if the above threshold value is used, a leakage current of the FET at the OFF time is greatly increased, and as a result, the power consumption of the device at the standby time is greatly increased and the semiconductor integrated circuit for the portable information device cannot be suitably used as it is.

FIG. 2 shows the construction of a semiconductor integrated circuit and a power supply system thereof constructed by taking the above problem into consideration. In FIG. 2, four kinds of power supply voltages (VDD, VD1, VS1, VSS) including a ground potential are supplied to a semiconductor integrated circuit 506. A 3V power supply voltage (VDD) supplied from a lithium battery 500, a ground potential (VSS), and VD1 and VS1 supplied from a power supply conversion circuit 501 are supplied to a logic circuit 502 integrated on a chip in the semiconductor integrated circuit 506. In this case, a potential difference between the logic circuit power supply voltage VD1 and the logic circuit ground voltage VS1 is set at 0.5V.

With the above construction, the logic circuit 502 is operated by use of two voltages VD1 and VS1 to lower the power consumption at the operation time. Further, in the standby state, the well potential of a p-channel MOSFET 509 is set to VDD from VD1 by setting a p-channel MOSFET 507 to the ON state and the well potential of an n-channel MOSFET 510 is set to VSS from VS1 by setting an n-channel MOSFET 508 to the ON state. As a result, the absolute values of the threshold voltages of the MOSFETs 509 and 510 in the logic circuit at the standby time are increased and the leakage current at the OFF time thereof is reduced, thereby making it possible to lower the power consumption in the standby state.

As to the power supply for on-chip memory circuits 503, 504 and 505, the following three constructions are considered.

1) The chip power supply voltage VDD and chip ground potential VSS supplied from the lithium battery are used.
2) The logic circuit power supply voltage VD1 and chip ground potential VSS are used.
3) The chip power supply voltage VDD and logic circuit ground potential VS1 are used.

The construction 2) or 3) is better than the construction 1) from the viewpoint of power consumption, but the construction to be selected is finally determined by taking the range of the operation voltage of the memory circuit into consideration. In the semiconductor integrated circuit 506 of FIG. 2, the high level is VD1 and the low level is VS1 in the logic circuit 502, the high level is VDD and the low level is VSS in the memory circuit 503, the high level is VD1 and the low level is VSS in the level converter 504, the high level is VDD and the low level is VS1 in the memory circuit 505, and thus various logic swings and various logic levels are used.

FIG. 3 shows the construction of a semiconductor integrated circuit and a power supply system thereof constructed by taking a problem of a leakage current at the OFF time into consideration. In the circuit of FIG. 3, three kinds of power supply voltages are supplied to a semiconductor integrated circuit 605. That is, a power supply voltage (VDD) and ground potential (VSS) from a nickel-hydrogen secondary battery (1.2V) or lithium ion secondary battery 600 (3V) are supplied to a logic circuit 602 integrated on a chip in the semiconductor integrated circuit 605. A power supply voltage VDDV is supplied to a CMOS circuit in the logic circuit 602. The power supply voltage VDDV is obtained by passing the logic circuit power supply voltage VD1 (0.5V), which is supplied from the power supply conversion circuit 601, through a p-channel MOSFET 603 having a high threshold voltage With the above construction, in the standby state, after necessary information in the logic circuit is saved into the memory circuit 604, the gate voltage of the p-channel MOSFET 603 is set to VDD to set the MOSFET 603 into the OFF state. At this time, the leakage current of the logic circuit 602 becomes extremely small because it is determined by the OFF characteristic of the p-channel MOSFET 603 having a high threshold voltage.

However, since it is difficult to operate the memory circuit 605 on the power supply voltage of approximately 0.5V, it is driven by use of VDD and VSS, and the high level VD1 and the low level VSS are provided in the logic circuit and the high level VDD and the low level VSS are provided in the memory circuit, and thus two kinds of logic levels are used.

As described above, a multiple power supply system is indispensable for a portable device LSI, and a level converter of low power consumption for converting the logic levels according to the different power supply voltages is required. To transfer a signal from the semiconductor integrated circuit in which the logic swing is large to the logic circuit in which the logic swing is small, it is possible to effect the level conversion without causing any problem by use of a normal CMOS circuit as shown in FIG. 4 which uses MOSFETs having a gate breakdown voltage VBD higher than the logic swing (VDD–VSS).

However, it is difficult to convert the signal level of a logic circuit with a logic swing (0.5V in this example) that is as small as (VD1–VS1) to a large logic swing for the memory circuit. For example, in a normal CMOS inverter circuit shown in FIG. 4, various problems will occur when the signal level is sufficiently converted to the logic level of the memory circuit, for example, (VDD, VSS), (VD1, VSS), (VDD, VS1). That is, 1) the complete level conversion cannot be attained by use of the one-stage CMOS inverter, 2) neither the p-channel MOSFET nor the n-channel MOSFET can be cut OFF by use of the one-stage CMOS inverter and it is operated in the ON state as in a Class "A" amplifier, and as a result, a stationary short circuit current flows from the power supply to the ground node, and 3) if a multi-stage CMOS inverter is used, the power consumption becomes large.

As another method, there is provided a method using a differential amplifier and using an intermediate value between VD1 and VS1 as a reference voltage. However, even in this method, the power consumption becomes large by the following reasons: 1) a power supply for the differential amplifier is required and 2) a CMOS inverter for amplifying an output of the differential amplifier is required and a consumption current in the CMOS inverter stage is added.

In order to cope with the above problem, a level converter for converting the logic swing of approximately 0.5V to 1V to the logic swing of approximately 2V is proposed (Sub-1-V Swing Bus Architecture for Future Low-Power ULSIs by Nakagome et. al., 1992 VLSI Circuit Symposium, 9-2). The level converter disclosed in the above document is shown in FIG. 5 and attains the low power consumption characteristics.

The level converter of FIG. 5 includes gate-grounded MOSFETs 800 and 801 and two cross-coupled FETs constituted of two MOSFETs of the same channel type in which the gate and source of one MOSFET are respectively connected to the source and gate of the other MOSFET. However, since the logic swings of the gate voltages input to the cross-coupled MOSFETs of the same channel type are greatly different from each other, the driving capabilities of the MOSFETs constructing the cross-coupled FETs are resultantly greatly different if the two MOSFETs of the same size are used and it becomes difficult to attain the inverting operation by the MOSFET having a lower driving ability. Therefore, for each of the cross-coupled FETs, it is necessary to determine the sizes of the MOSFETs by taking the driving capabilities thereof into consideration.

Another problem with the level converter of FIG. 5 is that the tolerable amount for the element characteristics o is small. That is, a strict limitation is imposed on the element characteristics of the p-channel MOSFET 800 and n-channel MOSFET 801, and in order to attain the desired level conversion, for example, a MOSFET having a threshold voltage of 0V to approximately 0.05V is required. Requirements that a FET have such a special threshold voltage makes the manufacturing process complicated and since the tolerable range of the threshold voltage is as narrow as 100 mV, strict process control is required. Therefore, finally, the cost of the semiconductor integrated circuit is increased.

FIG. 6 shows the simulation result of the characteristics of the level converter of FIG. 5. In this case VS1 and VSS are set to the same potential. As shown in FIG. 7, the simulation is carried out by use of a circuit in which inverters driven by power supply voltages VD1 and VS1 are cascade-connected in the preceding stage of a level converter 900 and buffer inverters driven by power supply voltages VDD and VSS are connected in the succeeding stage thereof. A delay time between a signal input to the preceding stage inverter to be subjected to the level conversion and a signal output from the succeeding-stage buffer inverter is derived. A capacitor of 1 pF is connected as a load to each buffer inverter. The delay time is derived by averaging a time (tr) from when an input signal IN rises from VS1 to (VD1+VS1)/2 until an output signal OUT is changed and rises from VSS to (VDD+VSS)/2 and a time (tf) from when the input signal IN falls from VD1 to (VD1+VS1)/2 until the output signal OUT is changed and falls from VDD to (VDD+VSS)/2 (refer to FIG. 8).

In FIG. 6, the distribution of delay times is shown in the unit of ns when the level converter of FIG. 5 is operated by changing the power supply voltages VDD and VD1. The power supply voltage VD1 is assigned on the column of FIG. 6 and the power supply voltage VDD is assigned on the row. Space portions in which the delay time is not described indicate that the level converter is not operated.

The level converter is operated even when VD1 is lowered to approximately 1.3V to 1.4V, but if VD1 becomes lower than 1.2V, it does not operate. It is considered that this is because a difference between the logic swings of the gate voltages input to the MOSFETs of the same channel type constructing the cross-coupled FETs becomes larger when VD1 becomes lower, and a difference between the driving abilities of the FETs also becomes larger so that the inverting operation by the FET having a lower driving ability will become difficult.

BRIEF SUMMARY OF THE INVENTION

This invention has been made in view of the above problems and provides a semiconductor integrated circuit for realizing a level converter having large tolerance for the element characteristic and low power consumption.

In accordance with the present invention there is provided a level converter circuit comprising:

a first input terminal for receiving a first input signal and a second input terminal for receiving a second input signal, wherein the first and second input signals are complementary;

a first output terminal for outputting a first output signal and a second output terminal for outputting a second output signal, wherein the first and second output signals are complementary and wherein the voltage swing of the first and second complementary input signals is smaller than the voltage swing of the first and second complementary output signals;

at least first and second charge transfer MISFETs connected to the first and second input terminals;

a differential amplifier having first internal input terminals and first internal output terminals wherein the first internal input terminals are connected to the at least first and second charge transfer MISFETS; and an output buffer having second internal input terminals and second internal output terminals wherein the second internal input terminals are connected to the first internal output terminals and the second internal output terminals are connected to the first and second output terminals.

Also in accordance with the present invention there is provided a level converter circuit comprising:

a first input terminal to which a first logic signal having a first logic swing is input;

a second input terminal to which a second logic signal which is an inverted signal of the first logic signal is input;

a first charge transfer MISFET having a first gate and a first conduction path wherein a conduction of the first conduction path is controlled by the first gate and wherein an end of the first conduction path is connected to the first input terminal;

a second charge transfer MISFET having a second gate and a second conduction path wherein a conduction of the second conduction path is controlled by the second gate and wherein an end of the second conduction path is connected to the second input terminal;

an amplifier having a first internal input terminal, a second internal input terminal, a first output terminal and a second output terminal wherein the other end of the first conduction path of the first charge transfer MISFET is connected to the first internal input terminal the other end of the second conduction path of the second charge transfer MISFET is connected to the second internal input terminal, the first output terminal outputs a third logic signal having a second logic swing different from the first logic swing, and the second output terminal outputs a fourth logic signal which is an inverted signal of the third logic signal.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 is a table showing the operation simulation result of the level converter of FIG. 5;

FIG. 14 is a table showing the operation simulation result of the level converter of FIG. 11;

FIG. 17 is a table showing the operation simulation result of the level converter of the third embodiment;

DETAILED DESCRIPTION OF THE INVENTION

Figure 1:
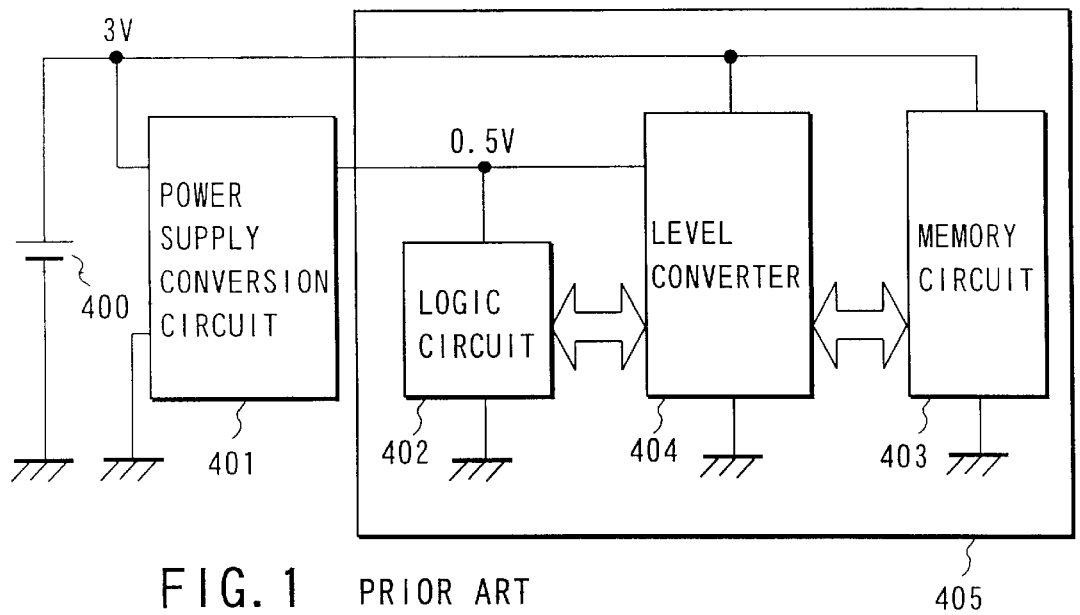
FIG. 1 is a block diagram showing the construction of a conventional semiconductor integrated circuit and a power supply system for supplying a plurality of power supply voltages thereto.

There will now be described an embodiment of this invention with reference to the accompanying drawings.

A level converter circuit according to an aspect of this invention (represented by FIG. 9 and accompanied with the reference symbols in FIG. 9 hereinbelow) comprises:

a first power supply line to which a first potential level (VDD, VSS) is applied;

a second power supply line to which a second potential level (VD1, VS1) different from the first potential level is applied;

a third power supply line to which a third potential level (VS1, VD1) different from the first and the second potential level is applied;

a first input terminal (10A) to which a first logic signal is input;

a second input terminal (10B) to which a second logic signal that is an inverted signal of the first logic signal is input;

a first MISFET (103, 101) of a first conductivity type having a first gate and a first conduction path, the first input terminal (10A) being connected to one end of the first conduction path and the first gate being connected to the second power supply line (VD1, VS1);

a second MISFET (104, 102) of the first conductivity type having a second gate and a second conduction path, the second input terminal (1OB) being connected to one end of the second conduction path and the second gate being connected to the second power supply line (VD1, VS1);

a third MISFET (105, 107) of a second conductivity type having a third gate and a third conduction path, the first power supply line (VDD, VSS) being connected to one end of the third conduction path;

a fourth MISFET (106, 108) of the second conductivity type having a fourth gate and a fourth conduction path, the first power supply line (VDD, VSS) being connected to one end of the fourth conduction path, the third gate being connected to the other end of the fourth conduction path, the fourth gate being connected to the other end of the third conduction path, the other end of the first conduction path being connected to the other end of the third conduction path and the other end of the second conduction path being connected to the other end of the fourth conduction path;

a first output terminal (10C, 10E) connected to the other end of the third conduction path;

a second output terminal (10D, 10F) connected to the other end of the fourth conduction path; and a buffer circuit (109, 110) connected to the first (VDD, VSS) and the third (VS1, VD1) power supply line, for outputting an output signal corresponding to at least one of signals of the other end of the third conduction path and the other end of the fourth conduction path.

Thus, since the gain characteristic of the cross-coupled FETs can be enhanced by supplying an output of the logic circuit operated on a low voltage and a logic inverted output thereof to two output terminals of a latch circuit constructed by cross-coupling two FETs via gate-grounded FETs, an output swing can be made larger by the cross-coupled FETs and the power consumption of the circuit can be lowered. Further, since the circuit margin can be made larger by use of complementary inputs, a limitation on the element characteristic can be alleviated.

Further, it is preferable to provide a buffer circuit operated on power supply voltages having a large level difference at the output side of the latch circuit constructed by cross-coupling two FETs. As the buffer circuit, in the level converter circuit according to the first and second aspects of this invention, a buffer circuit supplied with voltages from the first and third power supplies as the power supply voltages and outputting an output signal corresponding to a signal of the other end of the third or fourth FET is used, and as a result, a large logic swing corresponding to the difference between the voltages of the first and third power supplies can be obtained, for example. In this case, it is practically preferable to use two n-channel FETs whose current paths between the sources and drains are serially connected between the first and third power supplies and respectively connect the other ends of the third and fourth FETs to the gates of the two n-channel FETs.

Further, a level converter circuit according to another aspect of this invention (represented by FIGS. 9, 11, 15 and 16, and accompanied with the reference symbols in the above figures hereinbelow) comprises:

a first power supply line (VDD) to which a first potential level V1 is applied;

a second power supply line (VD1) to which a second potential level V2 which is not higher than V1 is applied;

a third power supply line (VS1) to which a third potential level V3 lower than V2 is applied;

a fourth power supply line (VSS) to which a fourth potential level V4 which is not higher than V3 is applied;

a first input terminal (10A, 20A) to which a first logic signal having V2 and V3 as logic levels is input;

a second input terminal (10B, 20B) to which a second logic signal that is an inverted signal of the first logic signal is input;

a first MISFET (103) of an n-channel type having a first gate, a first source and a first drain, the first source being connected to the first input terminal (10A, 20A) and the first gate being connected to the second power supply line (VD1);

a second MISFET (101) of a p-channel type having a second gate, a second source and a second drain, the second source being connected to the second input terminal (10B, 20B) and the second gate being connected to the third power supply line (VS1);

a third MISFET (104) of the n-channel type having a third gate, a third source and a third drain, the third source being connected to the second input terminal (10B, 20B) and the third gate being connected to the second power supply line (VD1);

a fourth MISFET (102) of the p-channel type having a fourth gate, a fourth source and a fourth drain, the fourth source being connected to the second input terminal (10B, 20B) and the fourth gate being connected to the third power supply line (VS1);

a fifth MISFET (105) of the p-channel type having a fifth gate, a fifth source and a fifth drain, the fifth source being connected to the first power supply line (VDD) and the fifth drain being connected to the first drain;

a sixth MISFET (106) of the p-channel type having a sixth gate, a sixth source and a sixth drain, the sixth source being connected to the first power supply line (VDD), the sixth drain being connected to the fifth gate and the third drain and the sixth gate being connected to the fifth drain;

a seventh MISFET (107) of the n-channel type having a seventh gate, a seventh source and a seventh drain, the seventh source being connected to the fourth power supply line (VSS), the seventh drain being connected to the second drain and the seventh gate being connected to the fourth drain; and an eighth MISFET (108) of the n-channel type having an eighth gate, an eighth source and an eighth drain, the eighth source being connected to the fourth power supply line (VSS), the eighth drain being connected to the seventh gate and the fourth drain, and the eighth gate being connected to the seventh drain;

wherein a third logic signal having logic levels of V1 and V3 and a fourth logic signal which is a complementary signal of the third logic signal are output from the fifth drain and the sixth drain, and a fifth logic signal having logic levels of V2 and V4 and a sixth logic signal which is a complementary signal of the fifth logic signal are output from the seventh drain and the eighth drain.

In the level converter circuit according to this aspect, a buffer circuit including p-channel and n-channel FETs whose current paths between the sources and drains are serially connected between the first power supply and the fourth power supply is further provided and one of the first-level and second-level outputs of the level converter is commonly supplied to the gates of the p-channel and n-channel FETs constructing the buffer circuit. With this construction, it is possible to obtain a large logic swing corresponding to a difference between voltages of the first and fourth power supplies. That is, level conversion from an output of the logic circuit operated on a low voltage to a desired logic swing can be attained, thereby making it possible to lower the power consumption of the whole system. Further, since the circuit margin can be made large by use of the complementary inputs, a limitation on the element characteristic can be alleviated.

Further, even when the buffer circuit is constructed by use of large-size FETs, a leakage current at the standby time can be suppressed by setting the absolute value of the threshold voltage of each FET in the buffer circuit larger than the absolute value of the threshold voltage of each FET in the level converter.

In addition, the operation speed of the level converter can be enhanced by driving a third latch circuit constructed by two cross-coupled FETs and connected between the circuits for complementary outputs whose levels are converted by the two cross-coupled FETs.

First Embodiment

Figure 9:
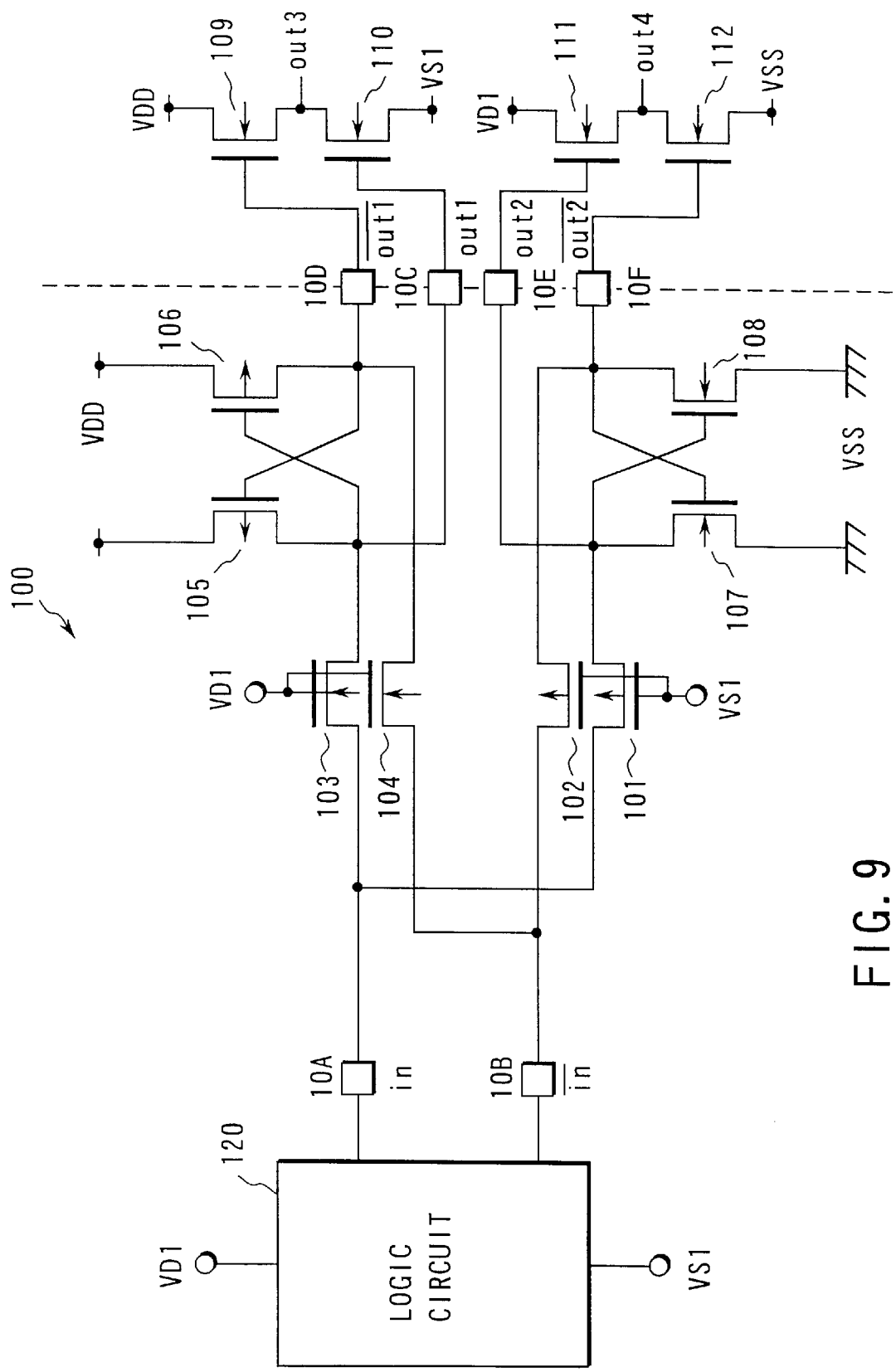
FIG. 9 is a circuit diagram for illustrating a level converter used in a semiconductor integrated circuit according to a first embodiment of this invention.

In FIG. 9, a level converter used in a semiconductor integrated circuit according to a first embodiment of this invention is shown. The semiconductor integrated circuit comprises a logic circuit, which operates on a low voltage, and a memory circuit, which operates on a voltage higher than the voltage of the logic circuit and is integrally formed together with the logic circuit on one chip. The level converter is provided between the logic circuit and the memory circuit.

The level converter 100 is used for converting a logic output level of approximately 0.5V from the logic circuit 120 to a level of 1V to 3V and outputting the level-converted voltage to the memory circuit. The level converter 100 includes gate-grounded p-channel MOSFETs 101 and 102 and n-channel MOSFETs 103 and 104 for receiving complementary signals 10A and 10B from the logic circuit. The level converter 100 further includes p-channel cross-coupled FETs constructed by p-channel MOSFETs 105 and 106 and an n-channel cross-coupled FETs constructed by n-channel MOSFETs 107 and 108.

The gates of the p-channel MOSFETs 101 and 102 are connected to VS1 which is a ground power supply terminal of the logic circuit 120 and the gates of the n-channel MOSFETs 103 and 104 are connected to VD1 which is a positive power supply terminal of the logic circuit 120 and VD1>VS1. Further, the sources of the p-channel MOSFETs 105 and 106 are connected to VDD (VDD≧VD1) and the sources of the n-channel MOSFETs 107 and 108 are connected to VSS (VSS≦VS1). The drains of the p-channel MOSFETs 105 and 106 are respectively connected to the gates of the p-channel MOSFETs 106 and 105. Likewise, the drains of the n-channel MOSFETs 107 and 108 are respectively connected to the gates of the n-channel MOSFETs 108 and 107. Complementary outputs that are level-converted are derived from output terminals 10C and 10D and output terminals 10E and 10F of the respective cross-coupled FETs.

Figure 10A:
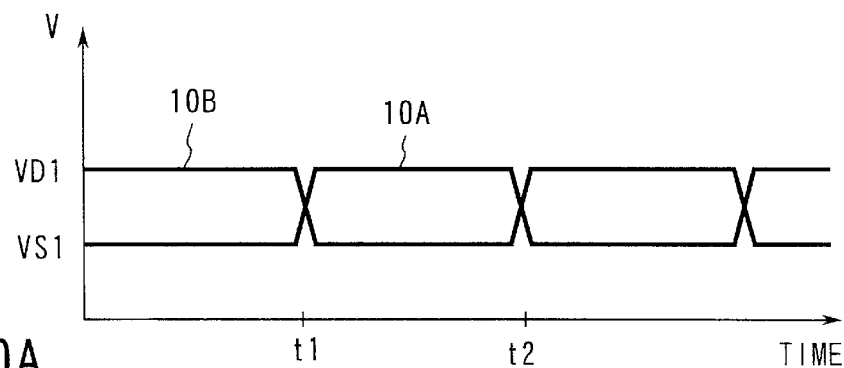
FIGS. 10A to 10C are waveform diagrams for illustrating the operation of the first embodiment.
Figure 10B:
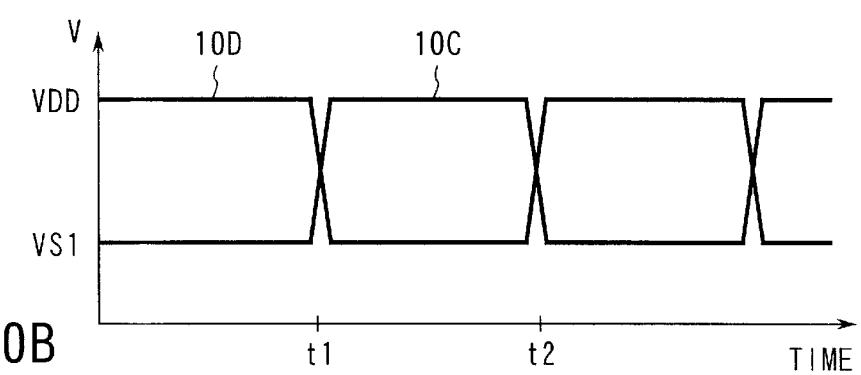

According to the above level converter 100, VD1 and VS1, which are logic levels of the logic circuit 120, are input to the input terminals 10A and 10B and are subjected to the level conversion as follows (refer to FIGS. 10A to 10C).

Assume now that the potential of the input terminal 10A is changed from VS1 to VD1 and the potential of the input terminal 10B is changed from VD1 to VS1. Since the n-channel MOSFET 103 is kept in the ON state until the potential of the drain of the MOSFET 105 in the p-channel cross-coupled FETs reaches VD1, the potential of the drain (10C) of the MOSFET 105 in the p-channel cross-coupled FETs changes towards VD1 (t1 in FIG. 10B) when the potential of the input terminal 10A is changed from VS1 to VD1 (t1 in FIG. 10A). On the other hand, the n-channel MOSFET 104 is kept in the OFF state, but it is set to the ON state since the potential of the input terminal 10B is changed from VD1 to VS1, and as a result, the potential of the drain (10D) of the MOSFET 106 in the p-channel cross-coupled FETs changes towards VS1 (t1 in FIG. 10B).

When the drain voltage of the MOSFET 105 rises to a value near VD1, the MOSFET 103 is turned OFF to separate the output terminal 10C from the buffer circuit in the logic circuit and the potential of the output terminal 10C is raised to VDD, which is the power supply voltage of the cross-coupled FETs. Further, since the MOSFET 104 is set to the ON state, the potential of 10D, which is the drain voltage of the MOSFET 106, is set to VS1 (a stationary period of time from t1 to t2 in FIG. 10B).

Thus, the level conversion from the logic levels VD1 and VS1 to VDD and VS1 can be attained by using the n-channel MOSFETs 103 and 104 with the gate-grounded structure and the p-channel cross-coupled FETs constructed by the p-channel MOSFETs 105 and 106. At this time, since the MOSFET 106 is set to the OFF state, almost no consumed current will flow via the MOSFET 106 and a consumed current flowing via the MOSFET 105 becomes extremely small since the gate-grounded n-channel MOSFET 103 is set in the OFF state and static power consumption will be substantially zero.

Further, as shown in FIG. 9, at the output sides of the p-channel cross-coupled FETs and n-channel cross-coupled FETs, a first output buffer constructed by n-channel MOSFETs 109 and 110 serially connected between VDD and VS1 and a second buffer of inverted-phase output type constructed by n-channel MOSFETs 111 and 112 serially connected between VD1 and VSS are provided. Since the output terminals 10D and 10C are respectively connected to the gates of the n-channel MOSFETs 109 and 110, an output out3 of a logic swing corresponding to a difference between the potentials of VDD and VS1 can be obtained from the first output buffer.

Figure 10C:
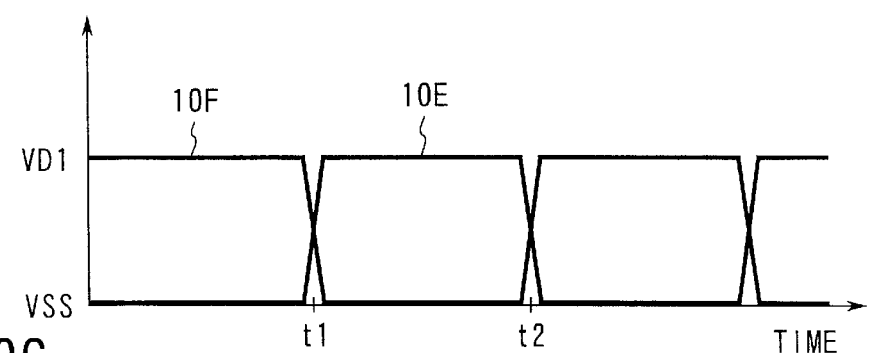

In this example, a case wherein the level conversion attained by using the n-channel MOSFETs 103 and 104 with the gate-grounded structure and the p-channel cross-coupled FETs constructed by the p-channel MOSFETs 105 and 106 is explained, but the level conversion from the logic levels VD1 and VS1 to VD1 and VSS can be attained by the same function of the p-channel MOSFETs 101 and 102 with the gate-grounded structure and the cross-coupled FETs constructed by the n-channel MOSFETs 107 and 108 (FIG. 10C). Further, since the output terminals 10E and 10F are respectively connected to the gates of the n-channel MOSFETs 111 and 112, an output out4 having an inverted phase with respect to the output out3 and having a logic swing corresponding to a difference between the potentials of VD1 and VSS is obtained from the second buffer.

As described above, the two FETs constructing each cross-coupled FETs can be driven by complementary inputs by supplying an output of the logic circuit operated on a low voltage and a logically inverted output thereof to each cross-coupled FETs via the gate-grounded circuit and the gain characteristic of the cross-coupled FETs can be enhanced. Since the p-channel MOSFETs 101 and 102 constructing the gate-grounded circuit perform the complementary operations and the n-channel MOSFETs 103 and 104 constructing the gate-grounded circuit perform the complementary operations, the operation margin of the circuit can be enlarged and a limitation on the element characteristic can be alleviated.

In the first embodiment (FIG. 9), the level conversion is effected on the positive side and negative side, but only the level conversion on the positive side can be effected by use of the gate-grounded n-channel MOSFETs 103 and 104 and the p-channel cross-coupled FETs constructed by the p-channel MOSFETs 105 and 106 or only the level conversion on the negative side can be effected by use of the gate-grounded p-channel MOSFETs 101 and 102 and the n-channel cross-coupled FETs constructed by the n-channel MOSFETs 107 and 108. Further, if a CMOS inverter is used as the output buffer, a construction in which only one of the complementary output signals of the cross-coupled FETs is input to the output buffer as an input signal can be utilized.

Second Embodiment

Figure 11:
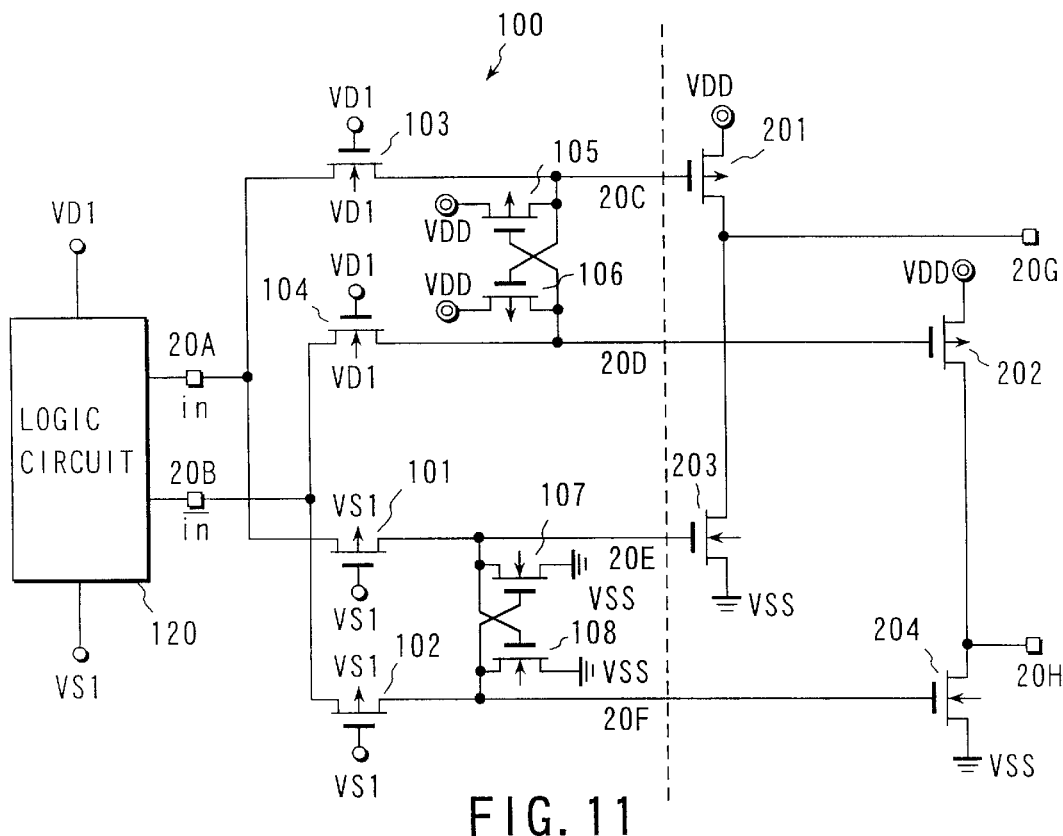
FIG. 11 is a circuit diagram for illustrating a level converter used in a semiconductor integrated circuit according to a second embodiment of this invention.

As shown in FIG. 11, a level converter according to a second embodiment of this invention includes a level converter 100, which is the same as that shown in FIG. 9 and receives complementary signals 20A and 20B from the logic circuit. The level converter 100 further includes p-channel MOSFETs 201 and 202 and n-channel MOSFETs 203 and 204 and outputs thereof obtained from 20G and 20H. A CMOS inverter constructed by the p-channel MOSFET 201 and n-channel MOSFET 203 is used as a first output buffer and a CMOS inverter constructed by the p-channel MOSFET 202 and n-channel MOSFET 204 is used as a second output buffer for out-putting an inverted output of the output of the first output buffer. Note that reference numerals 20A to 20H for terminals or nodes in FIG. 11 are sometimes used for waveforms or signals as shown in FIGS. 12A to 12D.

First, complementary outputs 20C and 20D (refer to FIG. 12B) whose levels are converted to VDD and VS1 from complementary inputs 20A and 20B (refer to FIG. 12A) having logic levels VD1 and VS1. Furthermore, complementary outputs 20E and 20F (refer to FIG. 12C) whose levels are converted to VD1 and VSS are obtained by use of the level converter 100 which is the same as that shown in FIG. 9. Since the logic levels of 20C and 20E are the same, a signal with the logic level VDD or VSS can be output to the output terminal 20G by inputting 20C to the gate of the p-channel MOSFET 201 and inputting 20E to the gate of the n-channel MOSFET 203 and thus the level conversion can be attained.

Likewise, a logically inverted output of the output terminal 20G output is obtained from 20H by inputting 20D to the gate of the p-channel MOSFET 202 and inputting 20F to the gate of the n-channel MOSFET 204. Thus, a larger logic swing corresponding to a difference between VDD and VSS can be obtained.

The circuit of this invention associated with FIGS. 9 and 11 is concretely explained. In this case, the result of the study based on the assumption that a 0.25 μm CMOS process is used is described.

First, VDD, VD1, VS1, and VSS are respectively set at 3V, 1.75V, 1.25V, and 0V as the power supply voltages. The effective power supply voltage (VD1−VS1) of the internal logic circuit is 0.5V and it is assumed that the logic swing of 0.5V is converted to 3V. It is now assumed that an output of the logic circuit is obtained as an output of the CMOS inverter, the gate width of the p-channel MOSFET thereof is 120 μm, the gate width of the n-channel MOSFET thereof is 60 μm, and the output of the inverter circuit is level-converted.

The gate width of the gate-grounded p-channel MOSFETs 101 and 102 is set to 30 μm, the gate width of the n-channel MOSFETs 103 and 104 is set to 15 μm, the gate width of the p-channel MOSFETs 105 and 106 in the cross-coupled FETs is set to 6 μm, the gate width of the n-channel MOSFETs 107 and 108 is set to 3 μm, the gate width of the n-channel MOSFETs 109 to 112 in the output buffer of FIG. 9 is set to 3 μm, the gate width of the p-channel MOSFETs 201 and 202 in the output buffer of FIG. 11 is set to 6 μm, and the gate width of the n-channel MOSFETs 203 and 204 is set to 3 μm. When making the study, the designed center of the threshold voltages of the FETs are so set that the threshold voltages of the MOSFETs 101 to 108 will be the same as those of the internal logic circuit (Vtp1=−0.15V in the case of p channel and Vtn1=0.15V in the case of n channel). Further, the threshold voltages of the n-channel MOSFETs in the output buffer of FIG. 9 and the MOSFETs 201 to 204 in the output buffer of FIG. 11 are set to slightly larger values as the absolute value in order to reduce the leakage power in the 3V power supply (Vtp2=−0.5V, Vtn2=0.5V).

Figures 13A, 13B:
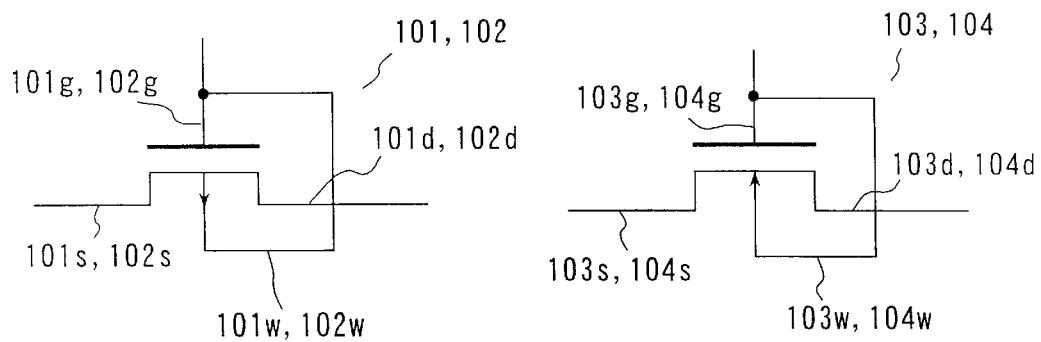
FIGS. 13A and 13B are diagrams for illustrating the potentials of wells of gate-grounded circuits used in the level converter of the first or second embodiment.
Figure 12A:
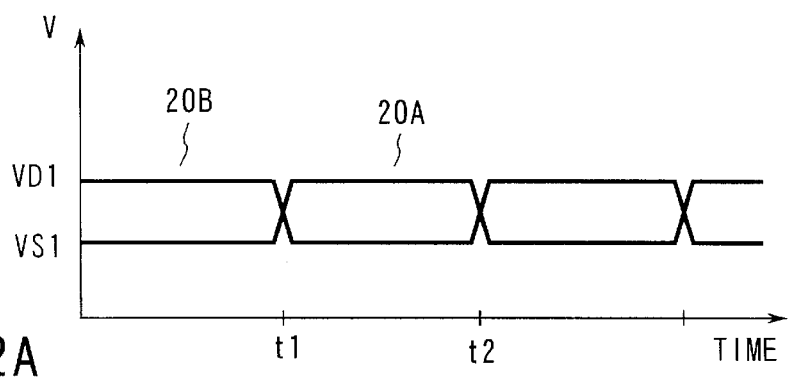
FIGS. 12A to 12D are waveform diagrams for illustrating the operation of the second embodiment.
Figure 12B:
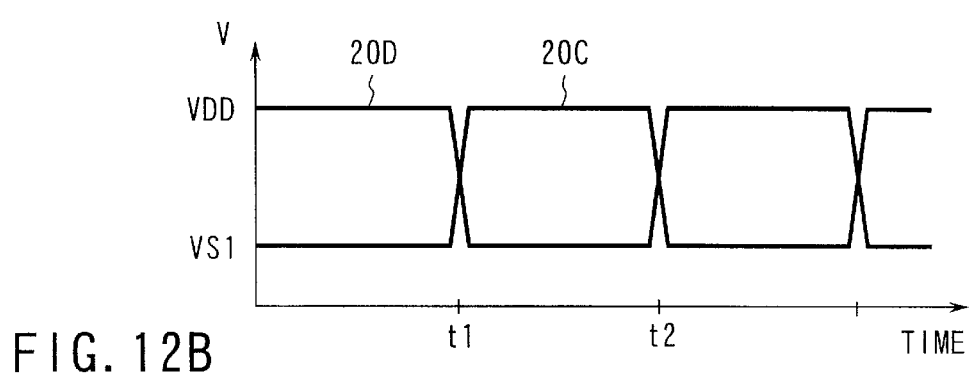
Figure 12C:
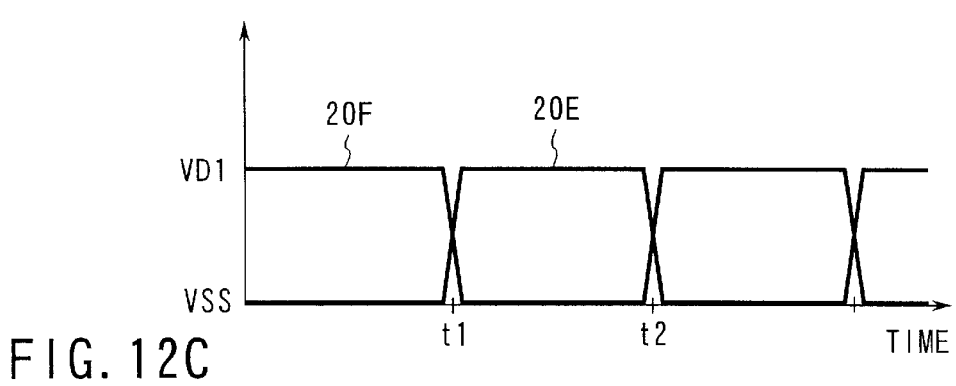
Figure 12D:
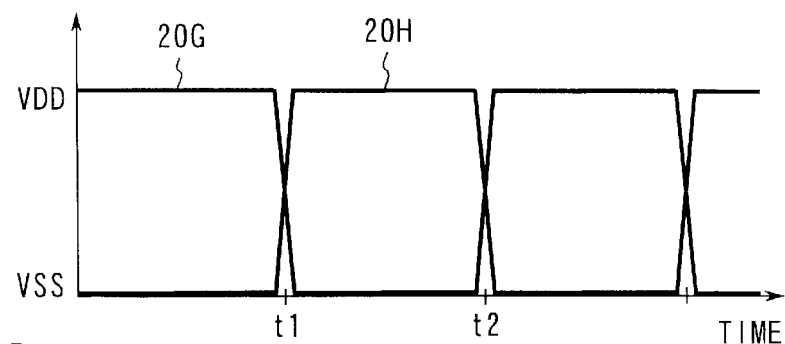

The operation is studied when a signal of 100 MHz is input with the threshold voltages of the p-channel and n-channel MOSFETs used as parameters. As shown in FIGS. 13A and 13B, the substrate potential (well potential) of the gate-grounded MOSFETs 101 to 104 is set to the same potential as the gate potential thereof in order to rapidly perform inversion of data in the cross-coupled FETs. The reason for this is to make it easy for the gate-grounded MOSFETs 101 to 104 to be set into the OFF state, and in practice, it means that the well potential of the MOSFETs in the CMOS process or the body potential of the MOSFET in the SOI process is set to the same potential as the gate voltage thereof.

Figure 18A:
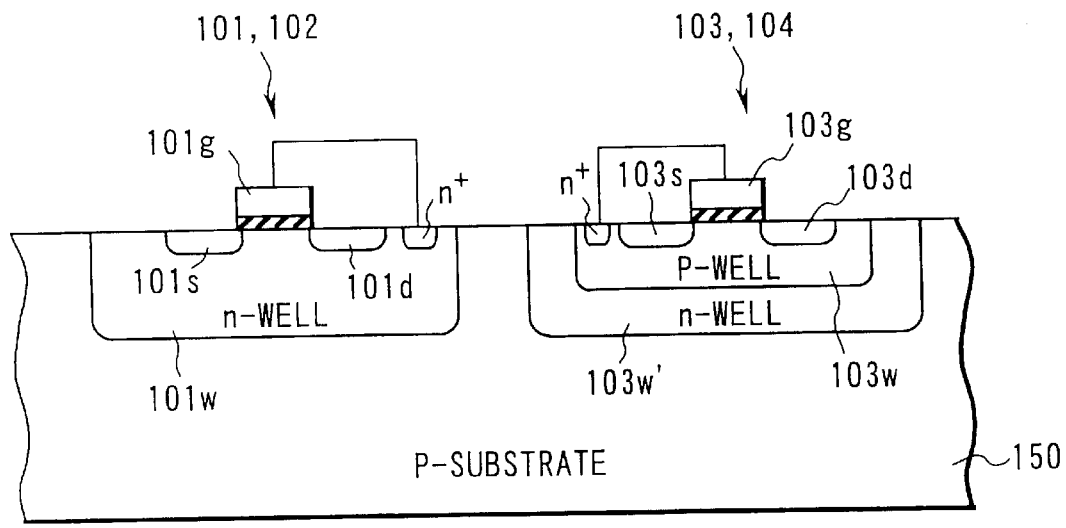
FIG. 18A shows a cross-sectional view of a semiconductor substrate having an n-channel MOSFET formed in a p-well and a p-channel MOSFET formed in an n-well on the surface thereof, and an illustrative interconnection between the gate and the well, correspondingly to the FIGS. 13A and 13B.

FIG. 18A is a cross-sectional view of a p-type semiconductor substrate 150 showing a p-channel MOSFET 101 formed in an n-well 101w, and an n-channel MOSFET 103 formed in a p-well 103w, which is formed in an n-well 103w', each formed on the surface of the semiconductor substrate 150, and an illustrative interconnection between the gate 101g/103g and the well 101w/103w. The same reference numerals are correspondingly assigned to the FIGS. 13A and 13B. The reference numerals 101s/103s and 101d/103d designate a source and drain, respectively, for the respective MOSFETs 101 and 103.

Figure 18B:
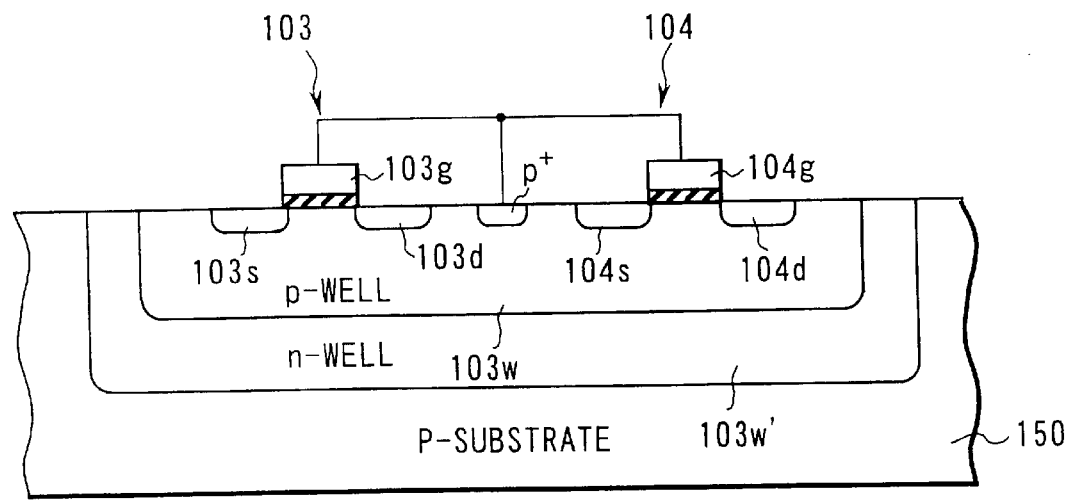
FIG. 18B shows a cross-sectional view of a semiconductor substrate having two p-channel MOSFETs formed in the same n-well on the surface thereof, and an illustrative interconnections between the gate and the well.

MOSFETs 103 and 104 of the same conductivity type (n-channel type) may be formed in the same p-well 103w, which is formed in an n-well 103w' as shown in FIG. 18B. Similarly, the p-channel type MOSFETs 101 and 102 may be formed in the same p-well. Reference numerals used in FIG. 18B are assigned in a same manner as in FIG. 18A, and correspond to FIGS. 13A and 13B.

Thus, the driving ability of the gate-grounded circuit for driving the cross-coupled FETs can be enhanced even if the element size thereof is small. Further, the p-channel MOSFETs 101 and 102 can be formed in the same n well and the n-channel MOSFETs 103 and 104 can also be formed in the same p well. With the above construction, the circuit area can be reduced.

The threshold voltage (|Vtp1|, Vtn1) of the internal logic circuit is changed from 0V to 0.25V which is larger than the variation range in the actual process and the threshold voltage (|Vtp2|, Vtn2) is changed from 0.3V to 0.7V, but it is confirmed that the circuit is operated without causing any problem. Further, it is also found that the operation characteristic does not substantially depend on Vtp2 and Vtn2.

Figure 5:
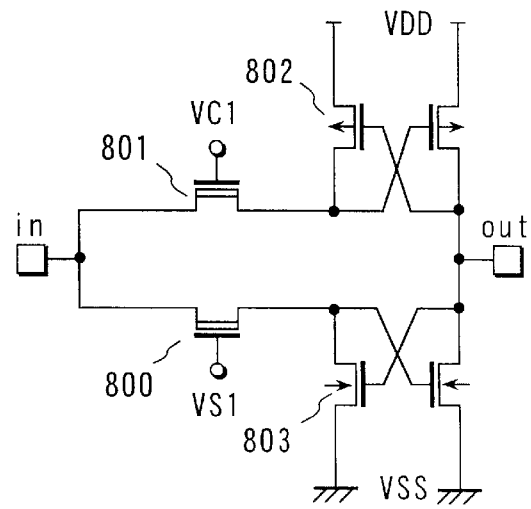
FIG. 5 is a circuit diagram showing a conventional level converter using cross-coupled FETs.
Figure 7:
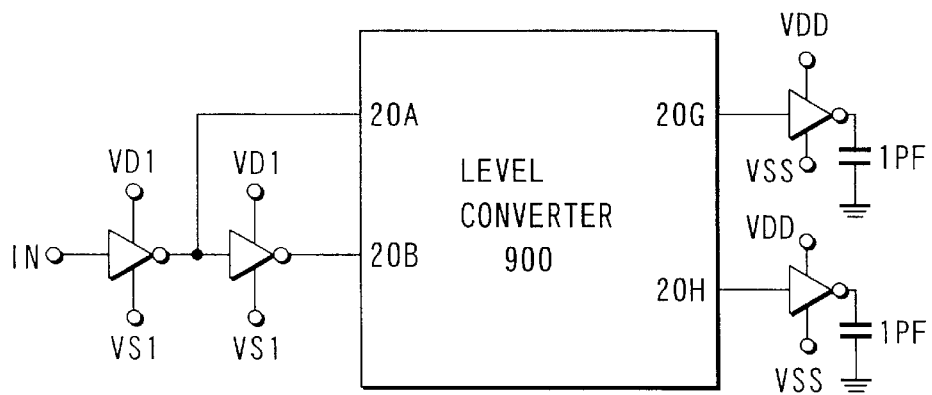
FIG. 7 is a circuit diagram of a circuit used for effecting the above operation simulation.
Figure 8:
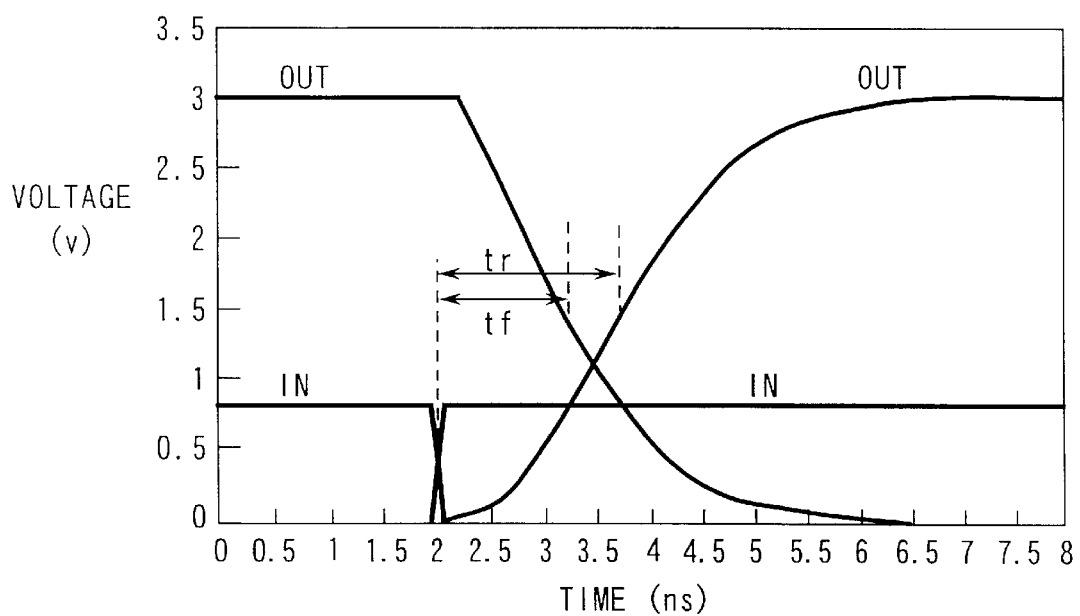
FIG. 8 is a diagram for explaining the definition of the operation speed in the above operation simulation.

On the other hand, in the conventional circuit shown in FIG. 5, the level conversion can be attained only in the narrow range of the threshold voltage of the MOSFETs 701 and 702 from approximately 0V to 0.05V as described before and it is confirmed that this invention is advantageous over the prior art in view of the tolerance for the element characteristic.

Figure 3:
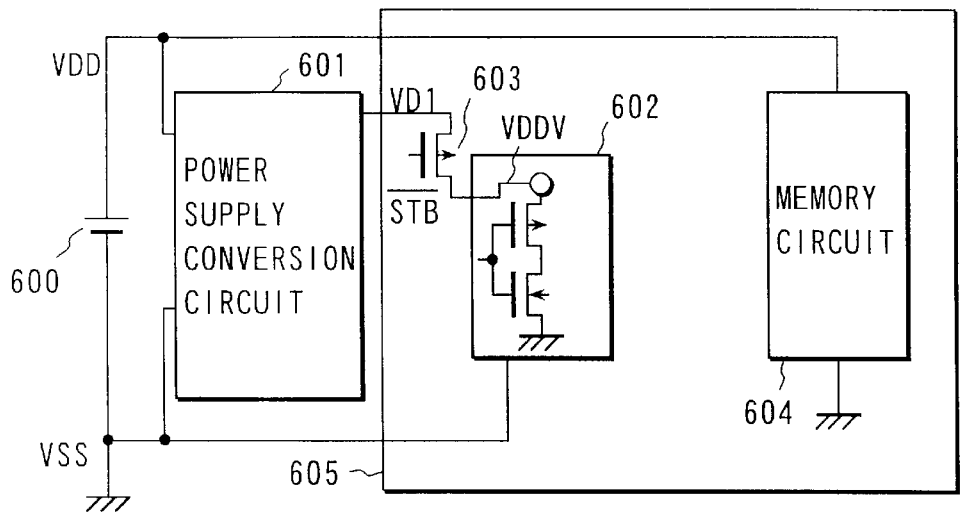
FIG. 3 is a block diagram showing the construction of another conventional semiconductor integrated circuit including a logic circuit operated on a low voltage and a power supply system for supplying a plurality of power supply voltages thereto.
Figure 4:
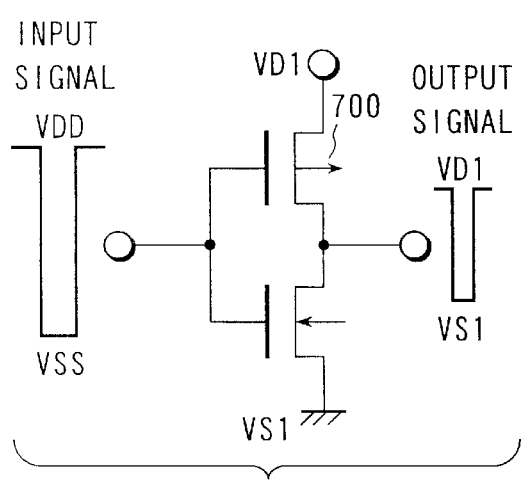
FIG. 4 is a circuit diagram showing a conventional level converter using a CMOS inverter.

The studies are made not only for the four power supplies but also for the three power supplies shown in FIG. 3, that is, VDD=3V, VD1=0.5V, VS1=VSS=0V, and VDD=1.2V, VD1=0.5V, VS1=VSS=0V and it is confirmed that the circuit is operated without causing any problem.

FIG. 14 shows the operation simulation result of the level converter of FIG. 11. The simulation condition is the same as described in "BACKGROUND OF THE INVENTION" with reference to FIG. 6. In the level converter of FIG. 11, the operation on the low VD1 side is greatly improved and the operation can be effected until VD1 reaches 0.4V. The circuit can be used as a voltage converter for a logic circuit operated on 0.5V and a memory circuit operated on VDD.

Third Embodiment

Figure 2:
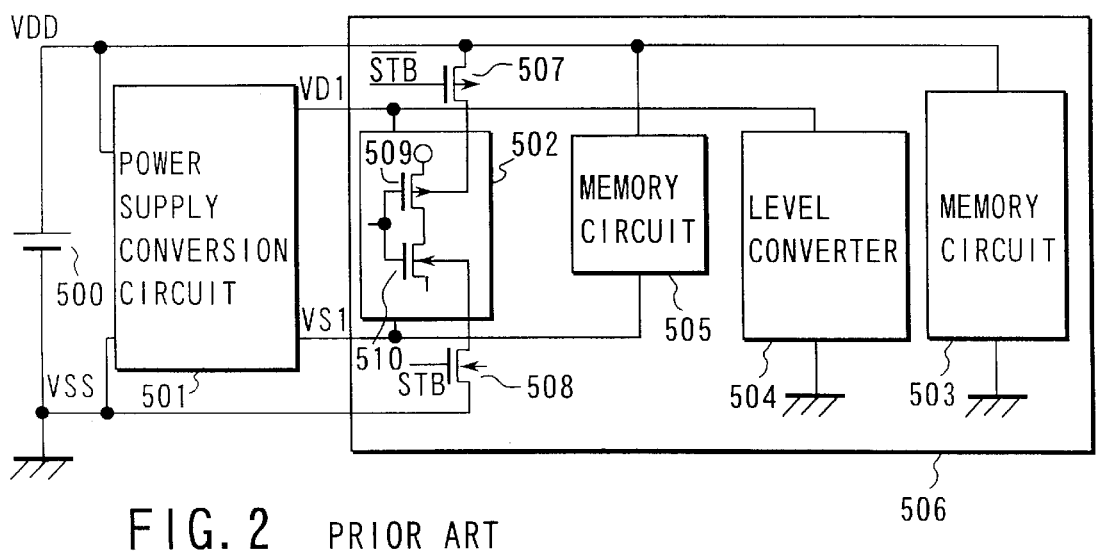
FIG. 2 is a block diagram showing the construction of a conventional semiconductor integrated circuit including a logic circuit operated on a low voltage and a power supply system for supplying a plurality of power supply voltages thereto.
Figure 15:
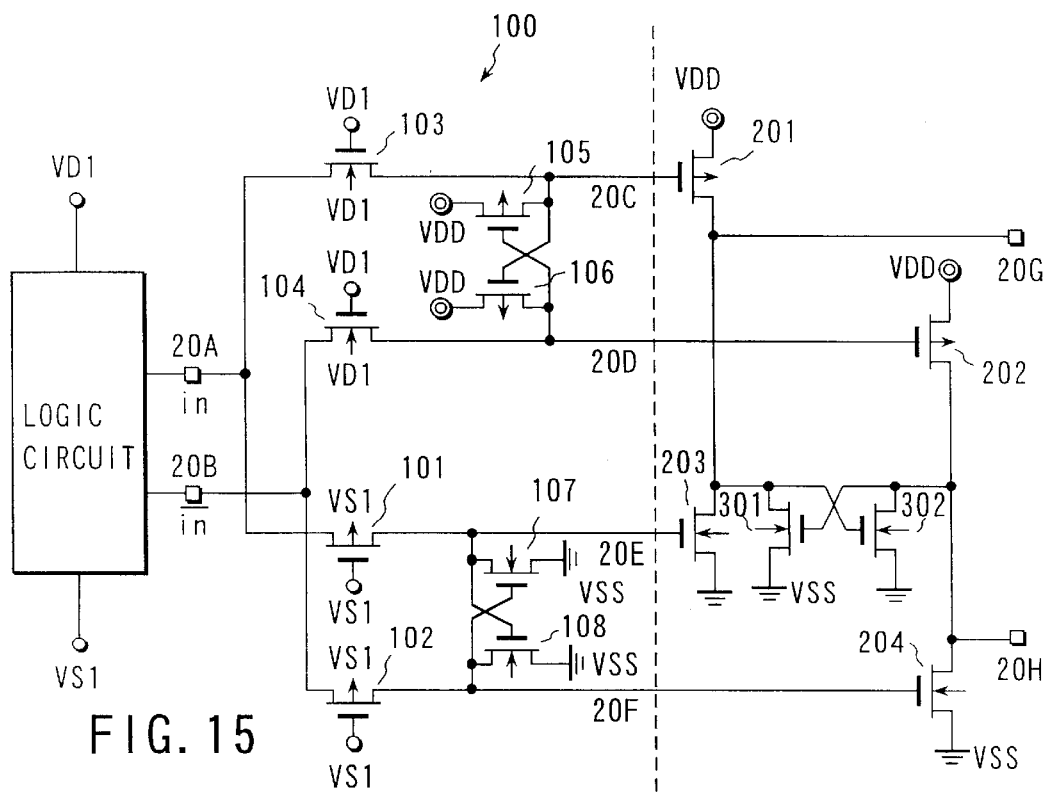
FIG. 15 is a circuit diagram for illustrating a level converter used in a semiconductor integrated circuit according to a third embodiment of this invention.

FIG. 15 shows a level converter used in a semiconductor integrated circuit according to a third embodiment of this invention. Portions which are the same as those of FIGS. 1 and 2 are denoted by the same reference numerals and the repetitive explanation therefore is omitted.

The operation of a circuit including a level converter 100 and an output circuit constructed by p-channel MOSFETs 201 and 202 and n-channel MOSFETs 203 and 204 is the same as that of the second embodiment. Now, the operation of the MOSFETs 203 and 204 is studied. The gates of the MOSFETs 203 and 204 are connected to 20E and 20F. The voltages of 20E and 20F after the level conversion are set to VD1 or VSS. The output circuits constructed by the MOSFETs 201 and 203 and the MOSFETs 202 and 204 are operated by VDD and VSS used as the power supply voltages, but the level of signals input to the MOSFETs 203 and 204 is VD1 which is a low level. Therefore, the speed of the operation of the output circuits for discharging the output terminals from VDD to VSS is slow. This is the reason why the operation speed becomes abruptly slow after VD1 becomes 0.6V or less as shown in FIG. 14 in which the operation of the level converter of the second embodiment is simulated.

In the third embodiment, to solve the above problem, third cross-coupled FETs constructed by MOSFETs 301 and 302 are provided. In the above explanation for the operation, 20C, 20D, 20E, and 20F are respectively set to VDD, VS1, VD1, and VSS after the level conversion. VDD is applied to the gate of the MOSFET 201 and VD1 is input to the gate of the MOSFET 203 to discharge the output terminal 20G towards VSS. However, the operation is slow. On the other hand, VS1 is supplied to the gate of the MOSFET 202 and VSS is supplied to the gate of the MOSFET 204 to charge the output terminal 20H towards VDD. The charging operation is effected at a high speed since the input voltage applied to the gate of the MOSFET 202 is set at VS1 which is a low voltage. The operation speed becomes higher as VD1 and VS1 of the power supply voltages of the logic circuit are lower.

The voltage of the output terminal 20H is input to the gate of the MOSFET 301 and the voltage of the output terminal 20G is input to the gate of the MOSFET 302. Since the output terminal 20H is charged from VSS towards VDD at a high speed, the MOSFET 301 supplied with a high gate voltage is operated with a low resistance to discharge the output terminal 20G connected to the drain thereof at a high speed. In comparison with a case wherein the output terminal 20G is discharged only by use of the MOSFET 203, the output terminals 20G can be discharged at a higher speed since the MOSFET 301 is additionally used.

Further, a case wherein the output of the logic circuit is logically inverted is explained in the same manner.

Figure 16:
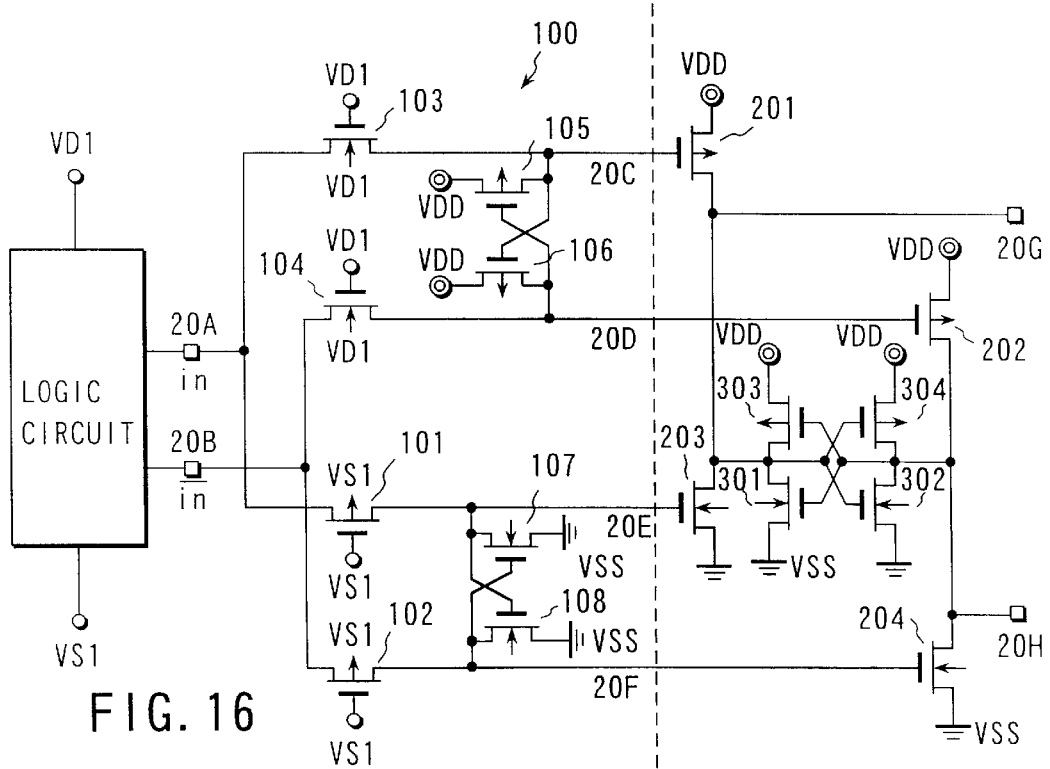
FIG. 16 is a circuit diagram for illustrating a level converter according to a modification of the third embodiment of this invention.

FIG. 16 is a circuit diagram showing a level converter according to a modification of the third embodiment of this invention. A circuit including the level converter 100 and the cross-coupled FETs connected thereto is the same as that of FIG. 15. Further, p-channel cross-coupled FETs constructed by p-channel MOSFETs 303 and 304 is additionally provided in the output circuit.

The drains of the p-channel MOSFET 303 and 304 are respectively connected to the output terminals 20G and 20H, the gates thereof are respectively connected to the drains of the MOSFETs 304 and 303 and the sources thereof are connected to the first power supply terminal VDD.

This modification is effective when the power supply voltage of the logic circuit 120 is not so low, for example, VD1=1.75V and VS1=1.25V and is converted to VDD=3V. When the gate voltage VS1 of the MOSFETs 201 and 202 is set to as a high level as 1.25V, the speed of the operation for charging the output terminals 20G and 20H from VSS to VDD becomes low. At this time, the charging speed is enhanced by use of the p-channel cross-coupled FETs constructed by the MOSFETs 303 and 304.

The whole operations of the circuits shown in FIGS. 15 and 16 are the same as that of the second embodiment explained with reference to FIG. 11. The operation speed is simulated in the third embodiment by changing the power supply voltage VDD from 2V to 3.3V and changing the power supply voltage VD1 of the internal logic circuit from 0.2V to 1.5V. The condition is the same as that shown in FIG. 6 and the result is shown in FIG. 17. The circuit is not operated when the power supply voltage VD1 of the internal logic circuit is set at 0.2V and 0.3V, but it is confirmed that the circuit is stably operated at a high speed in the other wide range. Particularly, even when VD1 is approximately 0.5V at which the operation speed is low in the second embodiment, the circuit is operated at a high speed.

The circuits (FIGS. 9, 11, 15 and 16) explained in the first to third embodiments are only examples and, for example, the following constructions can be used.

1) Any desired power supply voltages can be used if the condition of VDD>VD1>VS1>VSS is satisfied.
2) A single-phase output circuit can be used as the output circuit.
3) The present circuit can be applied to an input/output circuit.
4) The well potential or body potential of the gate-grounded circuit is set equal to the source potential.

Further, in the second and third embodiments (FIGS. 11, 15 and 16), the two output buffers of complementary outputs are used, but the construction having only one of the output buffers can be used.

In addition, an insulated gate type is used as the FET and MIS (Metal Insulated Semiconductor) type FETs in which various gate-insulating films are used in addition to a silicon oxide film used in the MOSFET can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A level converter circuit comprising:
    a first power supply line configured to receive a first potential level;
    a second power supply line configured to receive a second potential level different from the first potential level;
    a third power supply line configured to receive a third potential level different from the first and the second potential level;
    a first input terminal configured to receive a first logic signal;
    a second input terminal configured to receive a second logic signal, which is an inverted signal of the first logic signal;
    a first MISFET of a first conductivity type having a first gate and a first conduction path wherein the first input terminal is connected to one end of the first conduction path and the first gate is connected to the second power supply line;
    a second MISFET of the first conductivity type having a second gate and a second conduction path wherein the second input terminal is connected to one end of the second conduction path and the second gate is connected to the second power supply line;
    a third MISFET of a second conductivity type having a third gate and a third conduction path wherein the first power supply line is connected to one end of the third conduction path;
    a fourth MISFET of the second conductivity type having a fourth gate and a fourth conduction path wherein the first power supply line is connected to one end of the fourth conduction path, the third gate is connected to the other end of the fourth conduction path, the fourth gate is connected to the other end of the third conduction path, the other end of the first conduction path is connected to the other end of the third conduction path, and the other end of the second conduction path is connected to the other end of the fourth conduction path;
    a first output terminal connected to the other end of the third conduction path;
    a second output terminal connected to the other end of the fourth conduction path;
    a fifth FET of the first conductivity type having a fifth gate and a fifth conduction path wherein one end of the fifth conduction path is connected to the first power supply line and the fifth gate is connected to the second output terminal;
    a sixth FET of the first conductivity type having a sixth gate and a sixth conduction path wherein one end of the sixth conduction path is connected to the other end of the fifth conduction path, the other end of the sixth conduction path is connected to the third power supply line, and the sixth gate is connected to the first output terminal; and
    a third output terminal connected to the one end of the sixth conduction path.

2. The level converter circuit according to claim 1, wherein the first potential level is higher than the second potential level, the first MISFET and the second MISFET are of an n-channel type, the third MISFET and the fourth MISFET are of a p-channel type.

3. The level converter circuit according to claim 1, wherein the first potential level is lower than the second potential level, the first MISFET and the second MISFET are of a p-channel type, the first gate and the second gate are connected to the second power supply line, the third MISFET and the fourth MISFET are of an n-channel type, and the one end of the third conduction path and the one end of the fourth conduction path are connected to the first power supply line.

4. A semiconductor integrated circuit comprising:
a semiconductor substrate;
a first well formed in a surface of the substrate;
a second well formed in the surface of the substrate; and
a level converter circuit formed in the surface of the substrate, the level converter circuit comprising:
a first power supply line configured to receive a first potential level;
a second power supply line configured to receive a second potential level different from the first potential level;
a third power supply line configured to receive a third potential level different from the first and the second potential level;
a first input terminal configured to receive a first logic signal;
a second input terminal configured to receive a second logic signal, which is an inverted signal of the first logic signal;
a first MISFET of a first conductivity type having a first gate and a first conduction path wherein the first input terminal is connected to one end of the first conduction path and the first gate is connected to the second power supply line;
a second MISFET of the first conductivity type having a second gate and a second conduction path wherein the second input terminal is connected to one end of the second conduction path and the second gate is connected to the second power supply line;
a third MISFET of a second conductivity type having a third gate and a third conduction path wherein the first power supply line is connected to one end of the third conduction path;
a fourth MISFET of the second conductivity type having a fourth gate and a fourth conduction path wherein the first power supply line is connected to one end of the fourth conduction path, the third gate is connected to the other end of the fourth conduction path, the fourth gate is connected to the other end of the third conduction path, the other end of the first conduction path is connected to the other end of the third conduction path, and the other end of the second conduction path is connected to the other end of the fourth conduction path;
a first output terminal connected to the other end of the third conduction path;
a second output terminal connected to the other end of the fourth conduction path; and
a buffer circuit connected to the first and the third power supply line, for outputting an output signal corresponding to at least one of signals of the other end of the third conduction path and signals of the other end of the fourth conduction path,
wherein the first MISFET and the second MISFET are formed in the first well and the second well, respectively.

5. The semiconductor integrated circuit according to claim 4, wherein potentials of the first well and the second well are set equal to the second potential level.

6. The semiconductor integrated circuit according to claim 4, wherein the first well and the second well are formed as the same well.

7. The semiconductor integrated circuit according to claim 4, wherein the first potential level is higher than the second potential level, the first MISFET and the second MISFET are of an n-channel type, the third MISFET and the fourth MISFET are of a p-channel type.

8. The semiconductor integrated circuit according to claim 4, wherein the first potential level is lower than the second potential level, the first MISFET and the second MISFET are of a p-channel type, the first gate and the second gate are connected to the second power supply line, the third MISFET and the fourth MISFET are of an n-channel type, and the one end of the third conduction path and the one end of the fourth conduction path are connected to the first power supply line.

9. A level converter circuit comprising:
a first power supply line configured to receive a first potential level V1;
a second power supply line configured to receive a second potential level V2 which is not higher than V1;
a third power supply line configured to receive a third potential level V3 lower than V2;
a fourth power supply line configured to receive a fourth potential level V4 which is not higher than V3;
a first input terminal configured to receive a first logic signal having V2 and V3 as logic levels;
a second input terminal configured to receive a second logic signal which is an inverted signal of the first logic signal;
a first MISFET of an n-channel type having a first gate, a first source, and a first drain wherein the first source is connected to the first input terminal and the first gate is connected to the second power supply line;
a second MISFET of a p-channel type having a second gate, a second source, and a second drain wherein the second source is connected to the first input terminal and the second gate is connected to the third power supply line;
a third MISFET of the n-channel type having a third gate, a third source, and a third drain wherein the third source is connected to the second input terminal and the third gate is connected to the second power supply line;
a fourth MISFET of the p-channel type having a fourth gate, a fourth source, and a fourth drain wherein the fourth source is connected to the second input terminal and the fourth gate is connected to the third power supply line;
a fifth MISFET of the p-channel type having a fifth gate, a fifth source, and a fifth drain wherein the fifth source is connected to the first power supply line and the fifth drain is connected to the first drain;
a sixth MISFET of the p-channel type having a sixth gate, a sixth source, and a sixth drain wherein the sixth source is connected to the first power supply line, the sixth drain is connected to the fifth gate, and the third drain and the sixth gate are connected to the fifth drain;
a seventh MISFET of the n-channel type having a seventh gate, a seventh source, and a seventh drain wherein the seventh source is connected to the fourth power supply line, the seventh drain is connected to the second drain, and the seventh gate is connected to the fourth drain; and
an eighth MISFET of the n-channel type having an eighth gate, an eighth source, and an eighth drain wherein the eighth source is connected to the fourth power supply line, the eighth drain is connected to the seventh gate, and the fourth drain and the eighth gate are connected to the seventh drain;
wherein a third logic signal having logic levels of V1 and V3 and a fourth logic signal which is a complementary signal of the third logic signal are output from the fifth drain and the sixth drain, and a fifth logic signal having logic levels of V2 and V4 and a sixth logic signal which is a complementary signal of the fifth logic signal are output from the seventh drain and the eighth drain.

10. The level converter circuit according to claim 9, further comprising a buffer circuit, the buffer circuit comprising:
a ninth MISFET of the n-channel type having a ninth gate, a ninth source, and a ninth drain wherein the ninth drain is connected to the first power supply line and the ninth gate is connected to the sixth drain;
a tenth MISFET of the n-channel type having a tenth gate, a tenth source, and a tenth drain wherein the tenth drain is connected to the ninth source, the tenth gate is connected to the fifth drain, and the tenth source is connected to the third power supply line;
an eleventh MISFET of the n-channel type having an eleventh gate, an eleventh source, and an eleventh drain wherein the eleventh drain is connected to the second power supply line and the eleventh gate is connected to the eighth drain; and
a twelfth MISFET of the n-channel type having a twelfth gate, a twelfth source, and a twelfth drain wherein the twelfth drain is connected to the eleventh source, the twelfth gate is connected to the seventh drain, and the twelfth source is connected to the fourth power supply line,
wherein a seventh logic signal having logic levels of V1 and V3 is output from a node of the ninth source and the tenth drain and an eighth logic signal having logic levels of V2 and V4 is output from a node of the eleventh source and the twelfth drain.

11. The level converter circuit according to claim 10, wherein absolute values of threshold voltages of the ninth MISFET to the twelfth MISFET in the buffer circuit are set to be not smaller than an absolute value of a threshold voltage of the first MISFET to the eighth MISFET in the level converter circuit.

12. The level converter circuit according to claim 9, further comprising a buffer circuit, the buffer circuit comprising:
a ninth MISFET of the p-channel type having a ninth gate, a ninth source, and a ninth drain wherein the ninth source is connected to the first power supply line and the ninth gate is connected to the fifth drain;
a tenth MISFET of the n-channel type having a tenth gate, a tenth source, and a tenth drain wherein the tenth drain is connected to the ninth drain, the tenth gate is connected to the seventh drain, and the tenth source is connected to the fourth power supply line;
an eleventh MISFET of the p-channel type having an eleventh gate, an eleventh source, and an eleventh drain wherein the eleventh source is connected to the first power supply line and the eleventh gate is connected to the sixth drain; and
a twelfth MISFET of the n-channel type having a twelfth gate, a twelfth source, and a twelfth drain wherein the twelfth drain is connected to the eleventh drain, the twelfth gate is connected to the eighth drain, and the twelfth source is connected to the fourth power supply line; and
wherein a seventh logic signal having logic levels of V1 and V4 is output from a node of the ninth drain and the tenth drain and an eighth logic signal, which is a complementary signal of the seventh logic signal, is output from a node of the eleventh drain and the twelfth drain.

13. The level converter circuit according to claim 12, wherein absolute values of threshold voltages of the ninth MISFET to the twelfth MISFET in the buffer circuit are set to be not smaller than absolute values of a threshold voltage of the first MISFET to the eighth MISFET in the level converter circuit.

14. The level converter circuit according to claim 12, further comprising:
a thirteenth MISFET of the n-channel type having a thirteenth gate, a thirteenth source, and a thirteenth drain wherein the thirteenth drain is connected to the tenth drain, the thirteenth gate is connected to the eleventh drain, and the thirteenth source is connected to the fourth power supply line; and
a fourteenth MISFET of the n-channel type having a fourteenth gate, a fourteenth source, and a fourteenth drain wherein the fourteenth drain is connected to the thirteenth gate, the fourteenth gate is connected to the thirteenth drain, and the fourteenth source is connected to the fourth power supply line.

15. The level converter circuit according to claim 14, further comprising:
a fifteenth MISFET of the p-channel type having a fifteenth gate, a fifteenth source, and a fifteenth drain wherein the fifteenth drain is connected to the tenth drain, the fifteenth gate is connected to the eleventh drain, and the fifteenth source is connected to the first power supply line; and
a sixteenth MISFET of the p-channel type having a sixteenth gate, a sixteenth source, and a sixteenth drain wherein the sixteenth drain is connected to the fifteenth gate, the sixteenth gate is connected to the thirteenth drain, and the sixteenth source is connected to the first power supply line.

16. A semiconductor integrated circuit comprising:
a semiconductor substrate;
a first well formed in a surface of the substrate;
a second well formed in the surface of the substrate;
a third well formed in the surface of the substrate;
a fourth well formed in the surface of the substrate; and
a level converted circuit formed in the surface of the substrate, the level converter comprising:
a first power supply line configured to receive a first potential level V1;
a second power supply line configured to receive a second potential level V2 which is not higher than V1;
a third power supply line configured to receive a third potential level V3 lower than V2;
a fourth power supply line configured to receive a fourth potential level V4 which is not higher than V3;
a first input terminal configured to receive a first logic signal having V2 and V3 as logic levels;
a second input terminal configured to receive a second logic signal which is an inverted signal of the first logic signal;
a first MISFET of an n-channel type having a first gate, a first source, and a first drain wherein the first source is connected to the first input terminal and the first gate is connected to the second power supply line;
a second MISFET of a p-channel type having a second gate, a second source, and a second drain wherein the second source is connected to the first input terminal and the second gate is connected to the third power supply line;

a third MISFET of the n-channel type having a third gate, a third source, and a third drain wherein the third source is connected to the second input terminal and the third gate is connected to the second power supply line;

a fourth MISFET of the p-channel type having a fourth gate, a fourth source, and a fourth drain wherein the fourth source is connected to the second input terminal and the fourth gate is connected to the third power supply line;

a fifth MISFET of the p-channel type having a fifth gate, a fifth source, and a fifth drain wherein the fifth source is connected to the first power supply line and the fifth drain is connected to the first drain;

a sixth MISFET of the p-channel type having a sixth gate, a sixth source, and a sixth drain wherein the sixth source is connected to the first power supply line, the sixth drain is connected to the fifth gate, and the third drain and the sixth gate are connected to the fifth drain;

a seventh MISFET of the n-channel type having a seventh gate, a seventh source, and a seventh drain wherein the seventh source is connected to the fourth power supply line, the seventh drain is connected to the second drain, and the seventh gate is connected to the fourth drain; and an eighth MISFET of the n-channel type having an eighth gate, an eighth source, and an eighth drain wherein the eighth source is connected to the fourth power supply line, the eighth drain is connected to the seventh gate, and the fourth drain and the eighth gate are connected to the seventh drain;

wherein a third logic signal having logic levels of V1 and V3 and a fourth logic signal which is a complementary signal of the third logic signal are output from the fifth drain and the sixth drain, and a fifth logic signal having logic levels of V2 and V4 and a sixth logic signal which is a complementary signal of the fifth logic signal are output from the seventh drain and the eighth drain; and wherein the first MISFET to the fourth MISFET are formed in the first well to the fourth well, respectively.

17. The semiconductor integrated circuit according to claim 16, wherein potentials of the second well and the fourth well are set equal to the third potential level, and potentials of the first well and the third well are set equal to the second potential level.

18. The semiconductor integrated circuit according to claim 16, wherein the second well and the fourth well are formed as the same well, and the first well and the third well are formed as the same well.

* * * * *